(12) United States Patent
Otani et al.

(10) Patent No.: US 7,208,235 B2
(45) Date of Patent: Apr. 24, 2007

(54) METHOD FOR FORMING TRANSPARENT THIN FILM, TRANSPARENT THIN FILM FORMED BY THE METHOD, AND TRANSPARENT SUBSTRATE WITH TRANSPARENT THIN FILM

(75) Inventors: Tsuyoshi Otani, Osaka (JP); Masahiro Hirata, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 154 days.

(21) Appl. No.: 10/503,022

(22) PCT Filed: Jan. 31, 2003

(86) PCT No.: PCT/JP03/00963

§ 371 (c)(1),
(2), (4) Date: Jul. 28, 2004

(87) PCT Pub. No.: WO03/064343

PCT Pub. Date: Aug. 7, 2003

(65) Prior Publication Data

US 2005/0153072 A1 Jul. 14, 2005

(30) Foreign Application Priority Data

Jan. 31, 2002 (JP) .............................. 2002-023304

(51) Int. Cl.
*B32B 17/06* (2006.01)

(52) U.S. Cl. ...................... 428/704; 428/428; 428/432; 428/698; 428/699

(58) Field of Classification Search ................ 428/428, 428/432, 698, 699, 704
See application file for complete search history.

(56) References Cited

U.S. PATENT DOCUMENTS

| | | | |
|---|---|---|---|
| 5,539,154 A * | 7/1996 | Nguyen et al. | ......... 174/138 C |
| 6,114,043 A | 9/2000 | Joret | |
| 6,238,738 B1 | 5/2001 | McCurdy | |
| 6,248,397 B1 | 6/2001 | Ye | |
| 6,261,693 B1 * | 7/2001 | Veerasamy | ................... 428/408 |
| 6,312,808 B1 * | 11/2001 | Veerasamy et al. | ......... 428/408 |
| 6,338,901 B1 * | 1/2002 | Veerasamy | ................... 428/408 |
| 6,447,891 B1 * | 9/2002 | Veerasamy et al. | ......... 428/216 |
| 6,521,912 B1 * | 2/2003 | Sakama et al. | ................ 257/57 |
| 2001/0019158 A1 | 9/2001 | Tsujikawa et al. | |

FOREIGN PATENT DOCUMENTS

| | | |
|---|---|---|
| JP | 8-335581 | 12/1996 |
| JP | 10-309777 | 11/1998 |
| JP | 2000-100811 | 4/2000 |
| JP | 2001-176871 | 6/2001 |
| WO | 00/07954 | 2/2000 |

* cited by examiner

*Primary Examiner*—Jennifer McNeil
*Assistant Examiner*—G. Blackwell
(74) *Attorney, Agent, or Firm*—Hamre, Schumann, Mueller & Larson, P.C.

(57) ABSTRACT

The present invention provides a method for forming a transparent thin film by a chemical vapor deposition method using a gaseous raw material. In the method, a film growth rate is at least 8 nm/s, and the transparent thin film contains at least one selected from carbon (C) and oxygen (O), nitrogen (N), hydrogen (H), and silicon (Si). According to this method, a transparent thin film that does not peel off a substrate easily due to the eased tension in the thin film and has high transmittance in the visible light region can be deposited on a glass ribbon in a float bath.

21 Claims, 3 Drawing Sheets

METHOD FOR FORMING TRANSPARENT THIN FILM, TRANSPARENT THIN FILM FORMED BY THE METHOD, AND TRANSPARENT SUBSTRATE WITH TRANSPARENT THIN FILM

TECHNICAL FIELD

The present invention relates to a method for forming a thin film that contains silicon nitride (SiN) as its basic framework and, for example, carbon present therein and has a high visible-light transmittance. Furthermore, the present invention relates to a transparent substrate with a transparent thin film formed by the method, which is a transparent substrate with a transparent thin film that is suitable for uses such as, for example, buildings, vehicles, or displays.

BACKGROUND ART

A technique of forming a thin film on a glass substrate using a chemical vapor deposition method (hereinafter referred to as a "CVD method") is well known. The thin films to be formed are of various kinds and one of them is a silicon nitride (SiN) film. The silicon nitride thin film has been used widely as an insulating film in the field of semiconductors. In addition, since the silicon nitride thin film has a dense structure, it also is used as a barrier to the diffusion of various ions such as sodium, silver, etc., for example, as an acid-proof mask. A glass substrate with a silicon nitride thin film has high transmittance in the visible light region and thus is suitable for use for buildings, vehicles, or display substrates.

As a method for forming a silicon nitride thin film is known a method of depositing a film by an atmospheric CVD method using monosilane ($SiH_4$) and ammonia ($NH_3$). In the conventional film depositing method, however, the concentration of monosilane contained in a gaseous raw material was relatively low, for example, 0.1 mol % or lower. The silicon nitride thin film has high tension therein and may peel off a glass substrate in some cases, which has been a problem. As a means for solving this problem is known a technique of reducing the tension by including oxygen in a thin film to form a silicon oxynitride (SiON) film. For example, JP10(1998)-309777A discloses a technique of depositing a thin film containing silicon nitride and silicon oxynitride as its main components on the surface of a glass substrate by the CVD method.

Furthermore, for instance, JP2001-100811A discloses a method that takes into consideration the passivation function of a silicon nitride thin film, in order to form a perfect silicon nitride thin film, i.e. a silicon nitride thin film containing no impurities, and the flow ratio ($SiH_4/NH_3$) between monosilane and ammonia contained in the gaseous raw material is set at a low ratio, particularly, about 0.086 in a plasma-enhanced CVD method.

However, the film growth rate of silicon nitride and silicon oxynitride by the conventional CVD method is low, particularly about a few nm/s although it also depends on the film forming apparatus. In particular, when the above-mentioned thin film is deposited on the surface of a glass ribbon which floats on molten tin in a float bath in the process of producing float glass by the CVD method (hereinafter, this formation method is referred to as an "on-line CVD method"), it was difficult for the thin film to grow up to a thickness enough for its characteristics to be exhibited fully at a conventional film growth rate. In the on-line CVD method, it is conceived that when a thin film containing silicon nitride and silicon oxynitride as its main components is formed, a film growth rate of at least about 8 nm/s is required to make the thin film grow so that it has a thickness allowing its characteristics to be exhibited fully, although it also depends on the moving rate of the glass ribbon.

DISCLOSURE OF THE INVENTION

The present invention was made with the aforementioned problems in mind. The present invention is intended to provide a method for forming a transparent thin film that does not peel off a substrate easily due to the eased tension in the thin film and has high transmittance in the visible light region, at a high film growth rate that can be employed in an on-line CVD method. Furthermore, the present invention is intended to provide a transparent substrate with a transparent thin film obtained by the method, which is suitable for uses such as buildings, vehicles, displays, etc.

In order to achieve the above-mentioned objects, the present invention provides a method for forming a transparent thin film by a CVD method using a gaseous raw material, wherein the transparent thin film that contains at least one selected from carbon (C) and oxygen (O), nitrogen (N), hydrogen (H), and silicon (Si) is formed at a film growth rate of not less than 8 nm/s.

EMBODIMENTS OF THE INVENTION

In the formation method of the present invention, it is preferable that the gaseous raw material contains at least 0.2 mol % of a silicon-containing compound.

Preferably, the gaseous raw material contains a silicon-containing compound and ammonia. The mole ratio of the ammonia to the silicon-containing compound in the gaseous raw material may be set at, for example, 40 to 400.

It is preferable that the gaseous raw material contains monosilane ($SiH_4$) as a silicon-containing compound.

It also is preferable that the gaseous raw material is blown onto the surface of a glass ribbon in a float bath, although it may be blown onto a pre-cut glass sheet. A suitable surface temperature of the glass ribbon is, for example, 700° C. to 830° C. The glass ribbon may have a thickness of 4 mm or less, or a line speed of the glass ribbon may be as fast as the speed that allows the glass ribbon to be formed to have a thickness of 4 mm or less.

From another aspect, the present invention provides a transparent thin film formed by the method according to the present invention, wherein an atomic percentage of hydrogen content is 4 to 20 atom %, preferably 5 to 20 atom %. This transparent thin film can have a thickness of at least 40 nm while having a visible light transmittance of at least 83%.

From a further aspect, the present invention provides a transparent substrate with a transparent thin film, wherein the transparent thin film is formed on the surface of the substrate and is the above-mentioned transparent thin film of the present invention. It is preferable that the transparent substrate is a glass sheet. The transparent substrate with a transparent thin film further may include a functional thin film formed on the surface of the transparent thin film.

Hereinafter, a preferred embodiment of the present invention is described further with reference to the drawings.

Figure 1:
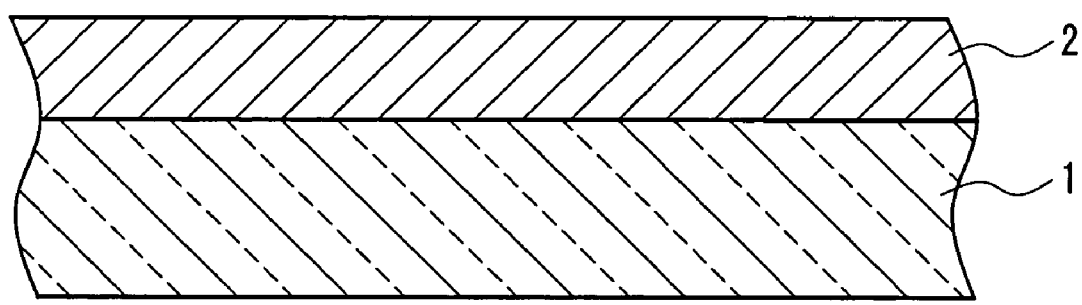
FIG. 1 is a cross-sectional view of an embodiment of a transparent substrate with a transparent thin film according to the present invention.

FIG. 1 shows a transparent substrate, for example, a glass substrate 1, that is covered with a transparent thin film 2 containing carbon and/or oxygen, nitrogen, hydrogen, and silicon as main components. The thin film 2 may be formed using a so-called physical vapor deposition method such as a sputtering method, an ion-plating method, a vacuum deposition method, or the like. In the present invention, however, a CVD method is employed. The physical vapor deposition method is excellent in uniformity of film thickness, but when consideration is given to, for example, durability of the thin film obtained after its formation, the film formation by the CVD method is preferable. Among the CVD methods, particularly an atmospheric thermal CVD is suitable. In some cases, a catalytic CVD method may be used in which a contact decomposition reaction of a gaseous raw material with a catalyst placed in the vicinity of the transparent substrate is utilized. The deposition of the thin film by the CVD method can be carried out through blowing of a gaseous raw material on a transparent substrate that has been cut into a predetermined size and has been heated. For instance, while a glass sheet is placed on a mesh belt and is conveyed through a heating furnace, a gaseous raw material is supplied to react at the surface of the glass substrate heated to a predetermined temperature.

It is preferable that the gaseous raw material for the transparent thin film contains at least a silicon-containing compound and ammonia. In this connection, examples of the silicon-containing compound include not only silicon hydride expressed as $Si_nH_{2n+2}$ but also an organic silicon compound. Besides silicon hydrides such as monosilane ($SiH_4$), disilane ($Si_2H_6$), for example, silicon hydrides in which at least a part of hydrogen is substituted with a halogen, such as silicon tetrachloride ($SiCl_4$), dichlorosilane ($SiH_2Cl_2$), silane trichloride ($SiHCl_3$), silicon tetrafluoride ($SiF_4$), etc., silane containing an alkyl group, such as tetramethylsilane ($(CH_3)_4Si$), etc. can be used. It is preferable that among them, monosilane is used. Since monosilane is easily reacts with ammonia, less by-products are produced during the film deposition and the content ratio of carbon, oxygen, and hydrogen in the transparent thin film can be adjusted in a broad range.

Ammonia is a nitrogen raw material that has been used conventionally in a CVD method, and is readily available and inexpensive. Conventionally, nitrogen, amines, hydrazine-type organic compounds, etc. also have been used as nitrogen raw materials. Nitrogen, however, is poor in reactivity. Moreover, organic compounds are difficult to be supplied as raw materials on an industrial production scale, and their toxicity becomes a problem when they are used on a production scale. The use of ammonia in a gaseous raw material can prevent carbon from being contained in the transparent thin film and thereby can improve the film growth rate.

It is preferable that the film growth rate of the transparent thin film is as high as possible for industrial production. For instance, in an example described in JP10(1998)-309777A, it is described that a silicon nitride thin film was deposited at a film growth rate of 60 nm/min=1 nm/s using silane and ethylamine as raw materials. In the present invention, compared with that disclosure, the film growth rate can be improved to 8 nm/s or higher by using a gaseous raw material containing, for example, silicon hydride and ammonia. In actual production, however, the uniformity of the transparent thin film tends to deteriorate with the increase in the film growth rate, and for example, its thickness may vary several-fold from portion to portion or defects such as pinholes may be caused. Hence, the film growth rate naturally has its limitations. Even in the on-line CVD method in which a higher film growth rate is required, if a film growth rate is 15 nm/s, a transparent thin film with a sufficient thickness substantially can be formed on a glass ribbon for one millimeter glass sheet for the production of which a higher rate speed is required. It therefore is preferable that a film growth rate of 8 to 15 nm/s is set as a target speed.

Preferably, the concentration of the silicon-containing compound in the gaseous raw material is at least 0.2 mol %. If this concentration is less than 0.2 mol %, the film growth rate may decrease to lower than 8 nm/s even when the surface temperature of the transparent substrate is 800° C. or more. Accordingly, it takes an excessively long time to form the film. Particularly, in an on-line CVD method, a film growth rate of lower than 8 nm/s causes a problem in that the thickness of a usable glass ribbon is limited to a range exceeding approximately 4 mm, although it also depends on the film depositing apparatus and operating conditions. On the other hand, when the concentration of the silicon-containing compound is excessively high, it becomes difficult to keep its mole ratio to ammonia within the above-mentioned range. Hence, an adequate upper limit of the concentration of the silicon-containing compound is 2.4 mol % in the CVD method. Furthermore, when the concentration of the silicon-containing compound is excessively high, not only does a thermal decomposition reaction proceed in a vapor phase to change it into a powdery state, which causes defects such as pinholes in the transparent thin film and decreases the film growth rate, but also there is a danger of explosion of the silicon-containing compound in the gaseous raw material. It therefore is practical to set the concentration of the silicon-containing compound at 1.4 mol % or lower.

Preferably, the mole ratio of ammonia to the silicon-containing compound in the gaseous raw material (the number of moles of ammonia/the number of moles of the silicon-containing compound) is 40 to 400. When the mole ratio is smaller than 40, a large number of Si—Si bonds are formed and thereby a thin film is formed that has its absorption band in the visible light region and thus has low transparency. On the other hand, when the mole ratio exceeds 400, not only it is difficult to increase the concentration of the silicon-containing compound in the gaseous raw material, but also ammonia inhibits the silicon-containing compound from being decomposed, which results in a decrease in the film growth rate. In this connection, with respect to the mole ratio of ammonia to the silicon-containing component, the ratio of ammonia is several times as high as that employed in the conventional method described in, for example, JP2000-100811A.

Oxygen to be provided in the transparent thin film is supplied from oxidizing raw materials such as, for example, dinitrogen monoxide, carbon monoxide, and carbon dioxide that are added to the gaseous raw material. Even when these oxidizing raw materials are not added to the gaseous raw material, oxygen may be provided in the vicinity of the surface of the transparent thin film through natural oxidation caused by the contact with the atmosphere after the film is formed. The carbon to be provided in the transparent thin film may be a residue of the organic silicon compound or may be supplied from lower hydrocarbon such as acetylene, ethylene, ethane, or the like that is added to the gaseous raw material to control the reactivity of the silicon-containing compound having high reactivity such as monosilane. The hydrogen to be provided in the transparent thin film is a residue of a silicon-containing compound containing hydrogen such as silane or the like, or ammonia. It is presumed that with these elements provided in the basic framework of silicon nitride, the nitrogen-silicon bond is cut at some sites, the tension of the transparent thin film is eased accordingly, and thus the transparent thin film does not peel off the transparent substrate easily.

To the gaseous raw material may be added nitrogen, helium, hydrogen, or the like in addition to the above-mentioned silicon-containing compound, ammonia, an oxidizing raw material, and lower hydrocarbon.

The transparent substrate on which the transparent thin film is formed is not particularly limited as long as it has corrosion resistance and thermal resistance to withstand the film formation performed by the CVD method and can be used for the above-mentioned uses such as windows of buildings or the like. Examples of the transparent substrate may include a glass sheet, a heat resistant resin, and the like.

When a glass sheet is used as the transparent substrate, a transparent thin film may be formed on the glass sheet that has been cut into a suitable size or may be formed at the same time the glass sheet is formed by the on-line CVD method, which is described later. In the industrial production, the latter in which the on-line CVD method is employed has more advantages. In the on-line CVD method, since a film is deposited on the surface of a glass ribbon having a heat that is higher than its softening point in a float bath, the heat of the glass ribbon promotes the thermal decomposition reaction of the gaseous raw material. As a result, heating required for the thermal decomposition reaction is no longer necessary, and thereby the total energy cost is reduced. Furthermore, the film growth rate and the film growth efficiency are improved, which prevents the defects such as pinholes from being caused. Moreover, when using the on-line CVD method, since the glass ribbon heated to a point higher than its softening point has some changeability in its surface form, the tension inside the film that is peculiar to the silicon-nitride-based thin film is reduced and thus a transparent thin film is formed that has high adhesiveness and high mechanical strength.

In the CVD method, the film growth rate further can be improved by spraying ammonia on the surface of the glass substrate or glass ribbon immediately before the deposition of a transparent thin film. Conceivably, this is because the ammonia that has come into contact with the glass substrate or glass ribbon is decomposed, and then adheres thereto, and thereby the thermal decomposition reaction proceeds rapidly at the time the silicon-containing compound is supplied. Furthermore, in order to promote the decomposition of ammonia, a catalyst may be placed in the vicinity of the surface of the glass substrate or glass ribbon.

Figure 2:
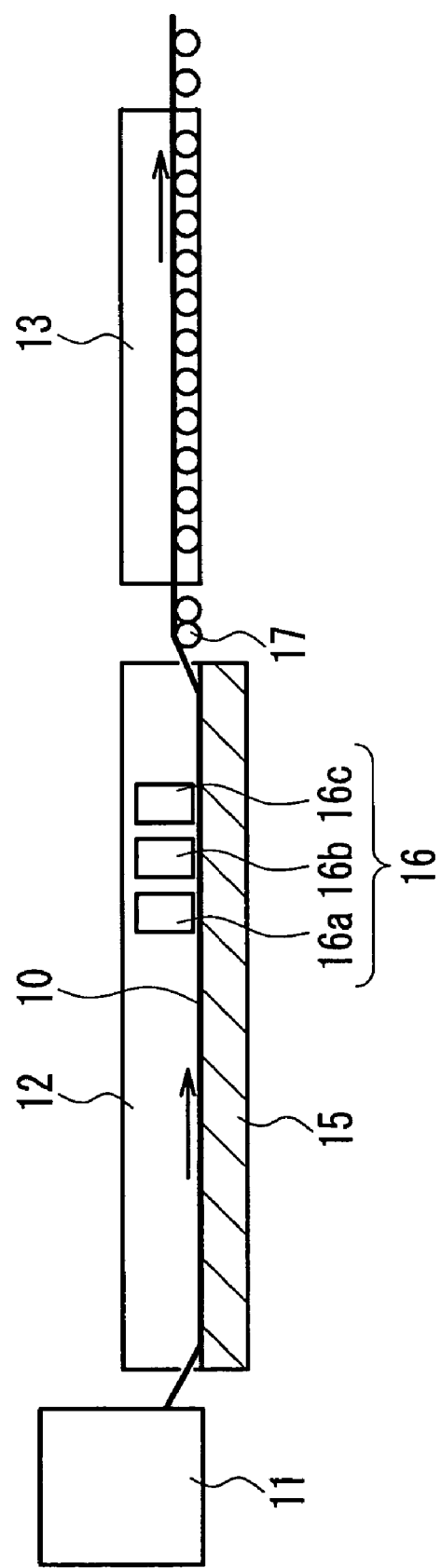
FIG. 2 is a schematic view of an appratus used in an on-line CVD method.

In the on-line CVD method, the apparatus shown in FIG. 2 is used. In this apparatus, a glass ribbon 10 is formed from molten glass, which is poured from a melting furnace (a float furnace) 11 into a float bath 12, and is in a belt-like form on a tin bath 15 while moving in the float bath 12. A predetermined number of coaters 16 (three coaters 16a, 16b and 16c in the embodiment shown in the figure) are placed inside the float bath at a predetermined distance from the surface of the glass ribbon 10. These coaters supply gaseous raw materials to form thin films on the glass ribbon 10 continuously. When a plurality of coaters are used, films can be stacked on the glass ribbon 10. The temperature of the glass ribbon is adjusted by a heater and a cooler (not shown in the figure) placed in the float bath so that the glass ribbon has a predetermined temperature directly before reaching the coaters 16. The glass ribbon 10 on which the respective films have been formed is lifted by a roller 17 and then is carried into an annealing furnace 13. The glass sheet annealed in the annealing furnace 13 is cut into a glass sheet with a predetermined size by a cutting device, which generally is used in the float glass process and is not shown in the figure.

Since the films are deposited in an upstream section inside the float bath, the thermal diffusion of tin (diffusion of tin vapor) into the surface (the upper face of the glass ribbon; the top surface) that is not in contact with the molten tin can be minimized. In the case where a large amount of tin diffuses into the upper surface of the glass ribbon, a passivation function tends to be deficient when the transparent thin film is relatively thin. For instance, in the case where a paste containing silver as its main component is applied onto the transparent thin film, which then is baked to form an electrode, if silver or tin passes through the transparent thin film, the silver and the tin react with each other to cause coloring, which often becomes a problem when it is used for a display. That is, the transparent thin film is formed in the upstream section inside the float bath, so that the problem caused by the passage of silver or tin can be solved without increasing the thickness of the transparent thin film.

In the on-line CVD method, generally, a film can be deposited on a glass ribbon having a surface temperature in the range of 500° C. to 850° C. This transparent thin film preferably is deposited on the glass ribbon having a surface temperature in the range of 700° C. to 830° C. immediately before its deposition. This is because when the surface temperature is in this range, the film growth rate is high and the tension in the thin film that is peculiar to the silicon nitride film is reduced due to the changeability of surface form of the glass ribbon, and thus a transparent thin film is formed that has an improved adhesiveness and high mechanical strength.

Since this transparent thin film contains silicon nitride as its basic framework, it has hardness, high transparency, and low absorptivity in the visible light region. Preferably, the atomic percentages of silicon and nitrogen in the transparent thin film are 35 to 45 atom % and 30 to 60 atom %, respectively. When the atomic percentage of silicon is lower than 35 atom %, the transparent thin film has deteriorated denseness and thereby the function providing a barrier to the diffusion of various ions is deteriorated. On the other hand, when the atomic percentage of silicon in the transparent thin film exceeds 45 atom %, the absorptivity in the visible light region increases and thereby the transparency of the thin film decreases. Furthermore, a preferable ratio of the atomic percentage of nitrogen to the atomic percentage of silicon in the transparent thin film is one that is as close to 1.3 as possible, which is the stoichiometric composition ratio of silicon nitride. When the ratio of the atomic percentage of nitrogen to the atomic percentage of silicon in the transparent thin film is lower than 0.9, the absorption in the visible light region increases and thereby the transparency of the thin film decreases. Accordingly, it is suitable to adjust the ratio of the atomic percentage of nitrogen to the atomic percentage of silicon in the transparent thin film within the range of 0.9 to 1.3.

It is preferable that the transparent thin film contains 1 to 10 atom % of at least one of carbon and oxygen. Carbon changes the absorptivity in the visible light region of the transparent thin film corresponding to its rate. On the other hand, oxygen eases the tension of the transparent thin film to reduce stress and thereby improves the adhesiveness to the transparent substrate as well as the mechanical strength. In order to allow these functions to be exhibited efficiently, it is preferable that the atomic percentage of carbon and oxygen is set within the range of 1 to 10 atom %. In this connection, either carbon or oxygen may be contained selectively or both may be contained. Furthermore, this transparent thin film contains hydrogen as its essential element. With the increase in rate of hydrogen content, the denseness of the transparent thin film deteriorates and accordingly the function of providing a barrier to the diffusion of various ions deteriorates. Hence, it is preferable that the rate of hydrogen content is 4 to 20 atom %.

The preferable thickness of the transparent thin film is at least 20 nm to secure the passivation function but not more than 300 nm to secure high visible-light transmittance. Moreover, since the reflectance increases with the increase in difference in refractive index between the transparent thin film and a transparent electroconductive film described later or the transparent substrate, a preferable refractive index of the transparent thin film is 1.8 to 2.1, which is relatively close to the refractive indices of a glass substrate and a transparent electroconductive film made of common tin oxide.

It is preferable that the transparent thin film has transmittance as high as possible. This transparent thin film can secure a visible-light transmittance of 83% even when having a thickness of 40 nm.

Figure 3:
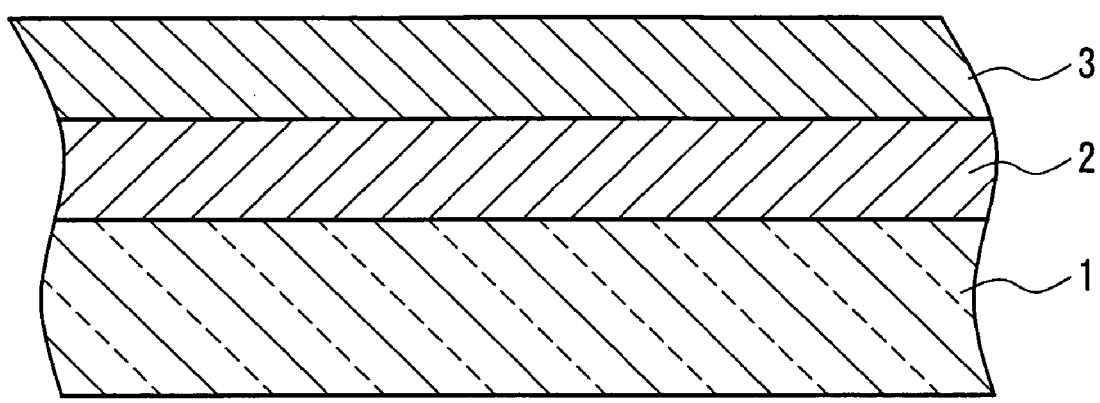
FIG. 3 is a cross-sectional view of an embodiment of a transparent substrate with a transparent thin film and a functional thin film stacked thereon.

FIG. 3 shows an example of a glass substrate with a thin film 3 stacked on a transparent thin film 2. The thin film 3 contains, as its main component, tin oxide ($SnO_2$), silicon dioxide ($SiO_2$), tin silicon oxide (SnSiO), silicon oxycarbide (SiOC), silicon carbide (SiC), or titanium dioxide ($TiO_2$). The thin film 3 is a functional thin film. A thin film containing tin oxide as its main component can function as a transparent electroconductive film. A thin film containing silicon dioxide and tin silicon oxide as its main component can function as a passivation film or an insulating film. A thin film containing silicon carbide as its main component can function as a passivation film, an insulating film, or a brown-colored film. A thin film containing titanium dioxide as its main component can function as a heat reflecting film or a film having a photocatalytic function. The combination of such a functional thin film 3 with the thin film 2 allows the reflectance, electroconductivity, passivation function, or the like to be adjusted suitably and the durability to be improved without impairing various functions of the transparent thin film.

In FIG. 3, the thin film 2 is formed on the surface of the glass substrate and the functional thin film 3 is formed thereon. However, the order and the number of films stacked on the glass substrate are not particularly limited and can be changed suitably according to the intended use and function. For instance, in the case of the configuration shown in FIG. 3, since the transparent thin film 2 with high chemical stability and high physical strength is covered with the functional thin film 3, a functional glass substrate with higher durability can be obtained.

The transparent thin film may have a composition that is substantially uniform in the direction of its depth, i.e. its film thickness or may have a composition gradient. Particularly, in the functional thin film, the composition near the interface between the functional thin film and the transparent thin film that is in contact therewith can be varied. This can improve, for example, the adherence between the transparent thin film and the functional thin film.

The glass substrate provided with this transparent thin film fully satisfies the characteristics required when used for buildings or vehicles. In particular, since silver-coloring does not occur in the glass substrate, it also can be used for displays, particularly for a plasma display panel substrate having stringent requirements.

In the present invention, the "main component(s)" denotes a component or components accounting for at least 50 wt. % of the whole components in terms of a weight ratio of its content, as it usually means.

EXAMPLES

Hereinafter, the present invention is described by means of examples but is not limited to the following examples.

Example 1

Low alkaline glass was produced by a float glass process, had a thickness of 1.1 mm, and had been cut into a square whose each side was 10 cm. The low alkaline glass thus produced was washed and then was dried. A transparent thin film containing silicon nitride as its main component was deposited on the glass sheet by the atmospheric CVD method. The film deposition was carried out under the condition that the glass sheet was conveyed in a furnace having a temperature of about 830° C. at a speed of 1.5 m/min. A gaseous raw material was supplied from a coater placed in the furnace to deposit a 40-nm thick transparent thin film containing silicon nitride as its main component on the surface of the glass substrate. In the gaseous raw material, the mole ratio of ammonia to monosilane was 200, the concentration of monosilane was 0.5 mol %, and nitrogen was contained as a carrier gas. In this case, the film growth rate was 10 nm/s.

It was confirmed by the X-ray photo-emission spectrometry and Rutherford backscattering spectrometry that the composition of the transparent thin film included 40 atom % of silicon, 43 atom % of nitrogen, 2 atom % of oxygen, and 15 atom % of hydrogen. The transparent thin film had a visible-light transmittance of 88.7% that was measured using a spectrophotometer, and a refractive index at 550 nm of 1.90 that was measured using an ellipsometer. These characteristics are at a level that causes no practical problems when it is used not only for buildings or vehicles but also for displays that require high transparency, particularly, substrates for plasma display panels that have stringent requirements. Moreover, the transparent thin film had a surface resistivity of at least $10^{10}$ Ω/□(square) and thus had a high insulation ability.

Furthermore, in order to check the passivation function of this transparent thin film, a silver paste was coated on the transparent thin film, which was baked at 500° C. for one hour. As a result, no silver-coloring (yellowing) was found. Since the low alkaline glass was produced by the float glass process, it can be judged whether tin is transmitted through the transparent thin film, based on whether the silver-coloring was caused or not. That is, the transparent thin film can be said to have a sufficient passivation function that is required when it is used for a display.

The conditions of film deposition and the characteristics of the transparent thin film are indicated together in Table 1 and Table 2.

Example 2

A thin film containing silicon nitride as its basic framework was deposited on the surface of a glass ribbon by the on-line CVD method using the apparatus shown in FIG. 2.

A melted glass material having a common soda-lime silica glass composition and a temperature of 1500° C. to 1600° C. was poured into a float bath. At the time the glass ribbon had a temperature of 830° C., a gaseous raw material was supplied from a first coater (16a indicated in FIG. 3) located on the furthest upstream side to form a 45-nm thick transparent thin film on the surface of the glass ribbon having a thickness of 2.8 mm. In the gaseous raw material, the mole ratio of ammonia to monosilane was 100, the concentration of monosilane was 0.4 mol %, and nitrogen was contained as carrier gas. In this case, the film growth rate was 9 nm/s. This glass ribbon was annealed in an annealing furnace, which then was cut into a predetermined size by a cutting device placed further downstream. Thus, a glass substrate was produced.

With respect to this transparent thin film, its characteristics were examined by the same means as in Example 1. As a result, the composition of the transparent thin film included 44 atom % of silicon, 41 atom % of nitrogen, 2 atom % of oxygen, and 13 atom % of hydrogen. The transparent thin film had a visible-light transmittance of 85.1%, a refractive index of 1.97, and a surface resistivity of at least $10^{10}$ Ω/□(square). Moreover, no silver-coloring was observed.

The conditions of film deposition and the characteristics of the transparent thin film are indicated together in Table 1 and Table 2.

Comparative Example 1

A thin film was formed as in Example 2 except that a gaseous raw material was used in which the mole ratio of ammonia to monosilane was 450 and the concentration of monosilane was 0.15 mol %. In this case, the film growth rate was 3 nm/s, and the thin film had a thickness of 15 nm. With respect to this thin film, its characteristics were examined by the same means as in Example 1. As a result, the composition of the thin film included 36 atom % of silicon, 40 atom % of nitrogen, 2 atom % of oxygen, and 22 atom % of hydrogen. The thin film had a visible-light transmittance of 89.5%, a refractive index of 1.85, and a surface resistivity of at least $10^{10}$ Ω/□(square). In addition, its transparency was high, but silver-coloring was observed. Hence, the thin film has a poor passivation function, and thus it can be said that the thin film cannot be used for displays that require high transparency.

The conditions of film deposition and the characteristics of the thin film are indicated together in Table 1 and Table 2.

Comparative Example 2

A thin film was deposited as in Example 2 except that a gaseous raw material was used in which ethylamine was used instead of ammonia, the mole ratio of ethylamine to monosilane was 25, the concentration of monosilane was 0.5 mol %, the film growth rate was 1 nm/s, and the thin film had a thickness of 4 nm. With respect to this thin film, its characteristics were examined by the same means as in Example 1. As a result, the composition of the thin film included 33 atom % of silicon, 31 atom % of nitrogen, 16 atom % of oxygen, and 21 atom % of carbon. The visible-light transmittance and refractive index of the thin film were not measured. However, as long as it was observed visually, its appearance had transparency that is comparable to that of the transparent thin film obtained in Example 1. In the thin film, the surface resistivity was at least $10^{10}$ Ω/□(square), but silver-coloring was observed. Hence, it can be understood that the thin film has a poor passivation function.

The conditions of film deposition and the characteristics of the thin film are indicated together in Table 1 and Table 2.

TABLE 1

| | Conditions of Film Deposition | | | | Composition of Thin Film (atom %) | | | | |
|---|---|---|---|---|---|---|---|---|---|
| | $NH_3/SiH_4$ (Mole Ratio) | Concentration of Silane (mol %) | Temperature of Glass (° C.) | Film Growth Rate (nm/s) | Si | N | O | H | C |
| Example 1 | 200 | 0.5 | 830 | 10 | 40 | 43 | 2 | 15 | 0 |
| Example 2 | 100 | 0.4 | 830 | 9 | 44 | 41 | 2 | 13 | 0 |
| Comparative Example 1 | 450 | 0.15 | 830 | 3 | 36 | 40 | 2 | 22 | 0 |
| Comparative Example 2 | 25[1)] | 0.5 | 830 | 1 | 33 | 31 | 16 | 0 | 21 |

[1)]Ethylamine was used instead of ammonia.

TABLE 2

| | Characteristics of Thin Film | | | | |
|---|---|---|---|---|---|
| | Film Thickness (nm) | Transmittance (%) | Refractive Index | Surface Resistivity (Ω/□) | Coloring due to Heat Treatment |
| Example 1 | 40 | 88.7 | 1.9 | $\geq 10^{10}$ | None |
| Example 2 | 45 | 85.1 | 1.97 | $\geq 10^{10}$ | None |
| Comparative Example 1 | 15 | 89.5 | 1.85 | $\geq 10^{10}$ | Yellow |
| Comparative Example 2 | 4 | Not Measured | Not Measured | $\geq 10^{10}$ | Yellow |

Through the comparison made between the examples and the comparative examples, it can be understood that the composition of the transparent thin film can be adjusted by varying the concentrations of silane and ammonia contained in the gaseous raw material used in the CVD method. In addition, it can be understood that the transparent thin film deposited under the film deposition conditions of the present invention has high visible-light transmittance, high insulation ability, and an excellent passivation function.

Specifically, through the comparison made between Examples 1 and 2 and Comparative Example 1, it is understood that the rate of silicon content in the thin film to be formed decreases with increase in mole ratio of ammonia to monosilane in the gaseous raw material. Furthermore, it also can be understood that with increase in the rate of silicon content, the visible-light transmittance of the thin film decreases and its refractive index increases.

With the above-mentioned configurations, the present invention provides the following effects. According to the method for depositing a transparent thin film of the present invention, a film growth rate can be achieved that is sufficiently high to allow the rate to be used in the on-line CVD method. By suitably maintaining the concentration of a silicon-containing compound and suitably adjusting the rate of ammonia content to the silicon-containing compound content in the gaseous raw material, a transparent thin film that has high transparency and does not peel off the transparent substrate easily can be deposited reliably while the film growth rate is kept high.

By using the film forming method of the present invention in the on-line CVD method, a transparent thin film with a large area having no defects such as pinholes can be formed in short time. Furthermore, in the on-line CVD method, since the energy required for the thermal decomposition reaction of the gaseous raw material is obtained from a glass ribbon, the total energy cost of the glass substrate with a transparent thin film can be reduced.

The glass substrate with a transparent thin film according to the present invention fully satisfies the characteristics required when it is used for buildings or vehicles. Especially, since no silver-coloring occurs, it is suitable for displays, particularly as substrates for plasma display panels having stringent requirements.

The invention claimed is:

1. A transparent thin film comprising nitrogen (N), hydrogen (H), and silicon (Si), and at least one selected from carbon (C) and oxygen (O), wherein an atomic percentage of hydrogen is 4 to 20 atom %, an atomic percentage of silicon is 35 to 45 atom %, and an atomic percentage of nitrogen is 30 to 60 atom %.

2. The transparent thin film according to claim 1, wherein the refractive index of the transparent thin film is 1.8 to 2.1.

3. The transparent thin film according to claim 1, wherein the film is formed by a chemical vapor deposition method using a gaseous raw material and the film is formed at a film growth rate of not less than 8 nm/s.

4. The transparent thin film according to claim 1, wherein the transparent thin film has a thickness of at least 40 nm and a visible-light transmittance of at least 83%.

5. A transparent substrate with a transparent thin film, comprising a transparent substrate and a transparent thin film formed on a surface of the transparent substrate, wherein the transparent thin film is a transparent thin film according to claim 1.

6. The transparent substrate with a transparent thin film according to claim 5, wherein the transparent substrate is a glass sheet.

7. The transparent substrate with a transparent thin film according to claim 5, further comprising a functional thin film formed on a surface of the transparent thin film.

8. A transparent thin film comprising nitrogen (N), hydrogen (H), and silicon (Si), and at least one selected from carbon (C) and oxygen (O), wherein an atomic percentage of hydrogen is 4 to 20 atom %, and an atomic percentage of carbon and oxygen is 1 to 10 atom %.

9. The transparent thin film according to claim 8, wherein the refractive index of the transparent thin film is 1.8 to 2.1.

10. The transparent thin film according to claim 8, wherein the film is formed by a chemical vapor deposition method using a gaseous raw material and the film is formed at a film growth rate of not less than 8 nm/s.

11. The transparent thin film according to claim 8, wherein the transparent thin film has a thickness of at least 40 nm and a visible-light transmittance of at least 83%.

12. A transparent substrate with a transparent thin film, comprising a transparent substrate and a transparent thin film formed on a surface of the transparent substrate, wherein the transparent thin film is a transparent thin film according to claim 8.

13. The transparent substrate with a transparent thin film according to claim 12, wherein the transparent substrate is a glass sheet.

14. The transparent substrate with a transparent thin film according to claim 12, further comprising a functional thin film formed on a surface of the transparent thin film.

15. A transparent thin film comprising nitrogen (N), hydrogen (H), and silicon (Si), and at least one selected from carbon (C) and oxygen (O), wherein an atomic percentage of hydrogen is 4 to 20 atom %, and the ratio of the atomic percentage of nitrogen to the atomic percentage of silicon is 0.9 to 1.3.

16. The transparent thin film according to claim 15, wherein the refractive index of the transparent thin film is 1.8 to 2.1.

17. The transparent thin film according to claim 15, wherein the film is formed by a chemical vapor deposition method using a gaseous raw material and the film is formed at a film growth rate of not less than 8 nm/s.

18. The transparent thin film according to claim 15, wherein the transparent thin film has a thickness of at least 40 nm and a visible-light transmittance of at least 83%.

19. A transparent substrate with a transparent thin film, comprising a transparent substrate and a transparent thin film formed on a surface of the transparent substrate, wherein the transparent thin film is a transparent thin film according to claim 15.

20. The transparent substrate with a transparent thin film according to claim 19, wherein the transparent substrate is a glass sheet.

21. The transparent substrate with a transparent thin film according to claim 19, further comprising a functional thin film formed on a surface of the transparent thin film.

* * * * *